United States Patent
Ghislotti et al.

(10) Patent No.: US 6,628,454 B1
(45) Date of Patent: Sep. 30, 2003

(54) OPTICAL AMPLIFIER WITH TWO DIRECTIONAL PUMPING

(75) Inventors: Giorgio Ghislotti, Montevecchia (IT); Stefano Balsamo, Cairo Montenotte (IT); Fiorenzo Trezzi, Agliate (IT)

(73) Assignee: Corning Oti SpA, Milan (IT)

(*) Notice: Subject to any disclaimer, the term of this patent is extended or adjusted under 35 U.S.C. 154(b) by 0 days.

(21) Appl. No.: 10/091,093

(22) Filed: Mar. 4, 2002

(51) Int. Cl.[7] .............................. G02B 6/26; H01S 3/13; H01S 3/67

(52) U.S. Cl. ............... 359/340; 359/341.3; 359/341.32; 372/18; 372/19; 372/32

(58) Field of Search ............................ 359/340, 341.31, 359/341.32; 372/18, 19, 32

(56) References Cited

U.S. PATENT DOCUMENTS

| | | | |
|---|---|---|---|
| 5,640,268 A | | 6/1997 | Chesnoy ........................ 359/341 |
| 5,768,012 A | * | 6/1998 | Zanoni et al. ................. 359/341 |
| 5,892,781 A | * | 4/1999 | Pan et al. ...................... 372/70 |
| 5,930,029 A | * | 7/1999 | Mehuys ......................... 359/341 |
| 5,991,070 A | * | 11/1999 | Zanoni et al. ................. 359/341 |
| 5,991,071 A | * | 11/1999 | Naito ............................ 359/341 |
| 6,327,402 B1 | * | 12/2001 | Joyce ............................ 359/341 |
| 2002/0085803 A1 | * | 7/2002 | Zarris et al. .................. 385/24 |

FOREIGN PATENT DOCUMENTS

| EP | 1170837 | * | 9/2002 |
|---|---|---|---|
| EP | 1170838 | * | 9/2002 |

OTHER PUBLICATIONS

Ghislotti et al, Electronics Letters, vol. 38, #24, PP 1541–2, Nov. 2002.*
Ghislotti et al, IEEE Photonic Tech. Lett., vol. 14, #6, PP 780–782, Jun. 2002.*
"The 980 nm pump laser module with built0in Isolator", Kimura et al. OSA Trends in Optics and Photonics, vol. 5, pp. 164–167, 1996.
"Simultaneous Wavelength–Stabilization of 980–nm Pump Lasers", Giles et al. IEEE Photonics Technology Letters, Aug. 1994, pp. 907–909, vol. 6, n. 8.
"Injection Locking Characteristics In Semiconductor Lasers" Kobayashi et al., Review of the electrical communication laboratories, vol. 31, n. 3, pp. 361–371.

* cited by examiner

*Primary Examiner*—Nelson Moskowitz
(74) *Attorney, Agent, or Firm*—Svetlana Z. Short

(57) ABSTRACT

A bidirectionally pumped optical amplifier comprises an active fibre having two ends, a first WDM coupler and a second WDM coupler coupled to said ends, a first pump branch coupled to said first WDM coupler comprising a first laser and a grating, for introducing pump radiation in said active fibre in a first direction, and a second pump branch coupled to said second WDM coupler comprising a second laser, for introducing pump radiation in said active fibre in a second direction, opposite to said first direction. A portion of unabsorbed pump residual propagating in the first direction is coupled in one of the two pump branches towards the pump laser included in the pump branch, and locks the emission wavelength of the pump laser. The other pump branch preferably comprises an optical isolator for the pump radiation. Preferably, the pump lasers emit in the 980 nm window.

14 Claims, 12 Drawing Sheets

OPTICAL AMPLIFIER WITH TWO DIRECTIONAL PUMPING

The present invention relates to a method for bidirectionally pumping an optical fibre amplifier and to a bidirectionally pumped optical amplifier. The present invention also relates to a method for stabilizing the optical emission of a laser.

BACKGROUND OF THE INVENTION

Erbium doped fibre amplifiers useful for telecommunication systems are pumped by high-power semiconductor lasers. In particular, high-power 1480 nm or 980 nm quantum well diode lasers are generally used. These lasers typically have Fabry-Perot optical cavities with no longitudinal mode selectivity and may emit over a broad wavelength range. However, the lasers must emit within an absorption band of the rare-earth ions in order to pump the amplifier. In the case of the 980 nm pumped amplifiers, the absorption band of erbium may be less than 15 nm wide, whereas the gain spectrum of a 980 nm pump laser may be as wide as 60 nm. Pump lasers must then meet stringent wavelength requirements and be immune to effects that might change the laser spectrum.

In the following of the description, a parameter called "free running wavelength" of the pump laser will indicate the operative wavelength of the laser, that is, the wavelength value of the peak of the gain spectrum of the pump laser when it is driven by a predetermined current. As the skilled in the art readily appreciates, in dependance of the driving current (or in dependance of the output power) of the laser the free running wavelength shifts, starting from a value $\lambda_{th}$, corresponding to the threshold current $I_{th}$ of the laser. $\lambda_{th}$ is generally referred as "threshold wavelength".

A known method for stabilizing the wavelength emission of a 980 nm pump laser is the use of a low reflectivity grating coupled to the output, anti-reflection coated, low-reflectivity facet of the laser. See, for example, a first article of Giles et al., Reflection-Induced Changes in the Optical Spectra of 980-nm QW Lasers, *IEEE Photonics Technology Letters*, Vol.6, No.8, August 1994. According to Giles et al.'s first article, the use uf the grating allows the reduction of the sensitivity of the pump laser to weak reflections that affect the laser emission spectrum.

In a second article (Giles et al., Simultaneous Wavelength-Stabilization of 980-nm Pump Lasers, *IEEE Photonics Technology Letters*, Vol.6, No.8, August 1994), the same authors disclose the simultaneous wavelength-locking and stabilization of three 980-nm pump lasers, connected to the input ports of a 4×4 fibre star coupler, through reflection from a single narrow-band fibre grating connected to one output port. According to Giles et al.'s second article introduction, injection-locking is a means for stabilizing laser sources, but may not be practical for the compact, low-cost sources required to pump the erbium doped fibre amplifier.

Injection-locking is a well known technique used to achieve single-longitudinal-mode operation of a multi-longitudinal-mode semiconductor laser by suppressing the side modes with continuous wave single-longitudinal-mode master laser injection phase-matched with the output emission of the injected laser and of a wavelength comprised in a locking bandwidth that ranges from 100 MHz to some GHz around the output emission $\lambda$. This technique is presently used in optical systems for precisely selecting wavelength emission of laser transmitters in a bandwidth of about 100 MHz; it has also been proposed for reducing frequency-chirped dynamic linewidth in directly modulated single-longitudinal-mode semiconductor laser transmitters (see for example C. Lin, J. K. Andersen, Frequency chirp reduction in a 2.2 Gbit/s directly modulated InGaAsP semiconductor laser by cw injection, *Electronics Letters*, Jan. 17, 1985, Vol.21 No.2).

FIG.1 shows a configuration of a known bidirectionally pumped optical fibre amplifier 100, comprising an amplifying doped optical fibre section 101, for example an erbium doped amplifying fibre, pump lasers 102, 103, WDM couplers 104, 105, optical isolators 106, 107 for light signals, input and output terminals 108, 109. A signal light is launched in the amplifier 100 through the input terminal 108, travels along the doped fibre section 101 to be amplified therein and exits through the output terminal 109. Suitable energy for amplification is provided by pump lasers 102, 103, which couple pump light to the doped fibre 101 through WDM couplers 104, 105. In particular, pump light from laser 102 is launched co-directionally in the doped fibre 101, that is in the same direction of the signal light, whereas pump light from laser 103 is launched counter-directionally, that is, in the opposite direction with respect to the signal light. For an erbium doped fibre amplifier, pump lasers 102, 103 may emit light whose wavelength is comprised in a pumping band centered around 980 nm or 1480 nm.

Herein and in the following of the description, the expressions "co-directionally", "counter-directionally", "co-propagating", "counter-propagating" will be always referred to the propagation direction of the signal light.

The configuration shown in FIG. 1 has a problem in that the residual pump light from each pump laser, not fully absorbed by the amplifying fibre, is injected into the opposite pump laser, which can result in optical instabilities and fluctuations in amplification of the optical signal.

It is known that such instability can be avoided by placing an isolator on the optical path of each of the pumps.

In patent U.S. Pat. No. 5,640,268 to Alcatel N.V. a solution is addressed to this problem. According to the '268 patent, each pump injection fibre includes a photorefractive pump filter constituting part of the resonant cavity of the associated pump laser, the two pump filters being mutually different to give rise to an offset between the two pumping bands. The two pumping bands are preferably offset by several nanometers. The pump filters are photorefractive gratings having a determined pitch and thus a determined central wavelength for reflection: the use of such a grating makes it possible simultaneously to reduce the width of the pumping band and to position said band more accurately within the spectrum.

Applicant has experimentally verified that in a configuration according to the '268 patent, if the wavelength emitted by the pump lasers is within the 980 nm pumping band the offset between the two pumping bands should be greater than 15 nm, in order to avoid instabilities due to residual pump injection. Since for an erbium doped fibre amplifier, the pumping band centered around 980 nm is only 10–15 nm wide, an offset between the two photorefractive filters of 15 nm or more would lead one of the pump wavelenghts to be nearly out of the pumping band of erbium, considerably reducing the bidirectional pumping efficiency.

SUMMARY OF THE INVENTION

Applicant has found that a pump laser, even without a stabilizing grating, can have a stable optical emission if it is injected by an external radiation having a wavelength close to the free running wavelength of the injected laser and having a sufficiently high power. A locking of the optical emission of the injected laser around the wavelength of the injection takes place. The useful "locking bandwidth", that is, the useful difference between the injected wavelength and the free running wavelength of the injected laser may range up to several nanometers. Stability of the optical emission means that at least 80% of the power emitted by the injected laser is comprised in a wavelength range of about 2 nm around the wavelength of the injection.

Applicant has also found that in a bidirectionally pumped optical amplifier a pump residual due to a pump radiation not absorbed in an active fibre, said pump radiation coming from a first pump laser used with a stabilizing grating, may have a sufficient power for stably locking the optical emission of a second pump laser, used without a stabilizing grating. This can lead to substantial elimination of the optical instability of the injected pump laser in the operative condition of the bidirectionally pumped amplifier. In such configuration, the first laser acts as a master and the second laser acts as a slave, in a master-slave configuration, achieving bidirectional pumping of the amplifying fibre with a pump light having the same wavelength traveling co and counter-directionally.

In a first aspect, the invention relates to a method for pumping an optical amplifier comprising an active optical fibre, a first pump laser and a second pump laser, the method comprising:
coupling a first pump radiation at a predetermined wavelength emitted by the first pump laser in the active fibre in a first direction,
coupling a second pump radiation emitted by the second pump laser in the active fibre in a second direction, opposite to the first direction,
characterized by further comprising
coupling a first pump residual in the first direction from the active fibre into the second pump laser, so as to lock the emission wavelength of the second pump laser around said predetermined wavelength.

Preferably, the difference between the free running wavelength of the second pump laser and said predetermined wavelength is lower than 18 nm, more preferably lower than 8 nm, even more preferably lower than 5 nm.

In preferred embodiments, said predetermined wavelength and said free running wavelength are comprised between 968 nm and 986 nm.

Preferably, a first power ratio between an output power of the second pump laser and a power of the first pump residual is lower than 15 dB, more preferably lower than 10 dB, even more preferably lower than 8 dB.

In an embodiment, the locked emission wavelength of the second pump laser is comprised in an emission bandwidth of at least 0.5 nm. In a further embodiment, the locked emission wavelength of the second pump laser is comprised in an emission bandwidth of about 2 nm.

In a second aspect, the invention relates to a bidirectionally pumped optical amplifier comprising:
an active fibre having two ends,
a first WDM coupler and a second WDM coupler coupled to said ends,
a first pump branch coupled to the first WDM coupler comprising a first laser and a selective reflector, for introducing pump radiation having a predetermined wavelength in the active fibre in a first direction,
a second pump branch coupled to the second WDM coupler comprising a second laser, for introducing pump radiation in the active fibre in a second direction, opposite to the first direction,
characterized in that
the amplifier is adapted for coupling a pump residual from the active fibre into said second laser, the pump residual being selected so that the emission wavelength of the second laser is locked around said predetermined wavelength.

Advantageously, the first pump branch further comprises an optical isolator for the pump radiation.

Preferably, the difference between said predetermined wavelength and the free running wavelength of the second laser is lower than 18 nm, more preferably lower than 8 nm, even more preferably lower than 5 nm.

In preferred embodiments, said predetermined wavelength and said free running wavelength are comprised between 968 nm and 986 nm.

Preferably, a power ratio between an output power of said second laser and a power of said pump residual is lower than 15 dB, more preferably lower than 10 dB, even more preferably lower than 8 dB.

In an embodiment, the locked emission wavelength of the second laser is comprised in an emission bandwidth of at least 0.5 nm. In a further embodiment, the locked emission wavelength is comprised in an emission bandwidth of about 2 nm.

Preferably, a length of said active fibre is lower than 15 m. Preferably, an output power of at least one of the first and second-pump lasers is higher than 15 mW, more preferably higher than 50 mW, even more preferably higher than 100 mW.

Typically, the bidirectionally pumped optical amplifier according to the second aspect of the invention further comprises a feedback system for at least regulating the output power of the first and second pump lasers.

Preferably, the selective reflector is a grating, more preferably a fibre grating.

Typically, the first and second lasers are semiconductor lasers. In preferred embodiments, the semiconductor lasers are AlGaAs-InGaAs lasers.

In a preferred embodiment, an optical amplifier comprises a pre-amplifying section, including at least one active fibre and at least one pump laser, and a booster section, including a bidirectionally pumped optical amplifier according to the second aspect of the invention.

Advantageously, an optical amplifier comprising a bidirectionally pumped optical amplifier according to the second aspect of the invention may be included along the optical transmission path of an optical transmission system comprising at least one transmitter and at least one receiver, coupled to said optical transmission path. Preferably, the optical transmission system is a WDM system.

In a third aspect, the invention relates to a method for stabilizing the optical emission of a laser having a predetermined output power and a predetermined free running wavelength, the method comprising:
injecting into said laser a radiation having a wavelength comprised in a predetermined locking band around said free running wavelength, said injecting radiation having a sufficient power for thereby locking the optical emission of the laser around the wavelength of said injecting radiation, characterized in that the width of said locking band is at least 0.5 nm.

Preferably, the width of the locking band is lower than 15 nm.

Preferably, a power ratio between the output power of the laser and the power of the injected radiation is lower than 15 dB, more preferably lower than 10 dB, even more preferably lower than 8 dB.

In an embodiment, the bandwidth of the locked optical emission is at least 0.5 nm. In a further embodiment, the bandwidth of the locked optical emission is about 2 nm.

Typically, the said locked optical emission is multi-longitudinal mode.

In preferred embodiments, said free running wavelength is comprised between 968 and 986 nm.

BRIEF DESCRIPTION OF THE DRAWINGS

There follows a detailed description of how the present invention can be implemented, the description being given by way of non-limiting example and with reference to the accompanying figures, in which.

DETAILED DESCRIPTION

Figure 1:
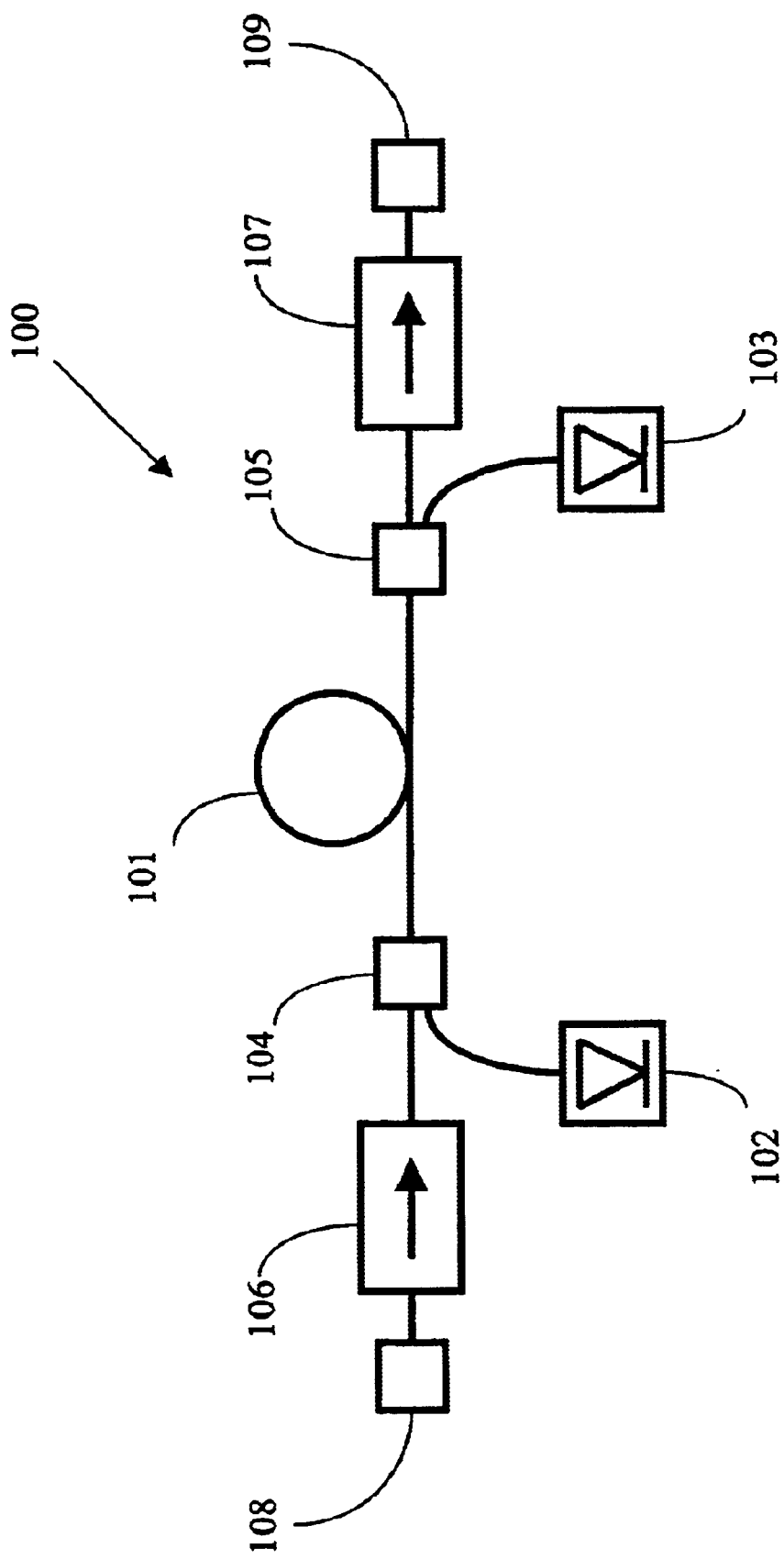
FIG. 1 diagrammatically shows a bidirectionally pumped optical amplifier according to prior art, already described.

In Erbium Doped Fibre Amplifiers (EDFAs) bidirectional pumping can result into a very efficient amplification of light signals. For example, FIG. 2 shows an embodiment of an optical amplifier 10 comprising a pre-amplifying section 11 and a booster section 12, comprised between an input terminal 13 and an output terminal 14, the two sections 11,12 being separated by an ASE filter 15.

The pre-amplifier section 11 is a double stage optical amplifier, comprising two erbium doped fibres (EDFs) 111, 111', separated by an isolator 112; pump light is furnished to the EDFs through WDM couplers 115, 116, respectively by pump lasers 113, 114.

The booster section 12 is a bidirectionally pumped optical amplifier, comprising an EDF 121 pumped co- and counter-directionally by two pump lasers 122, 123, through WDM couplers 124, 125 respectively.

Figure 2:
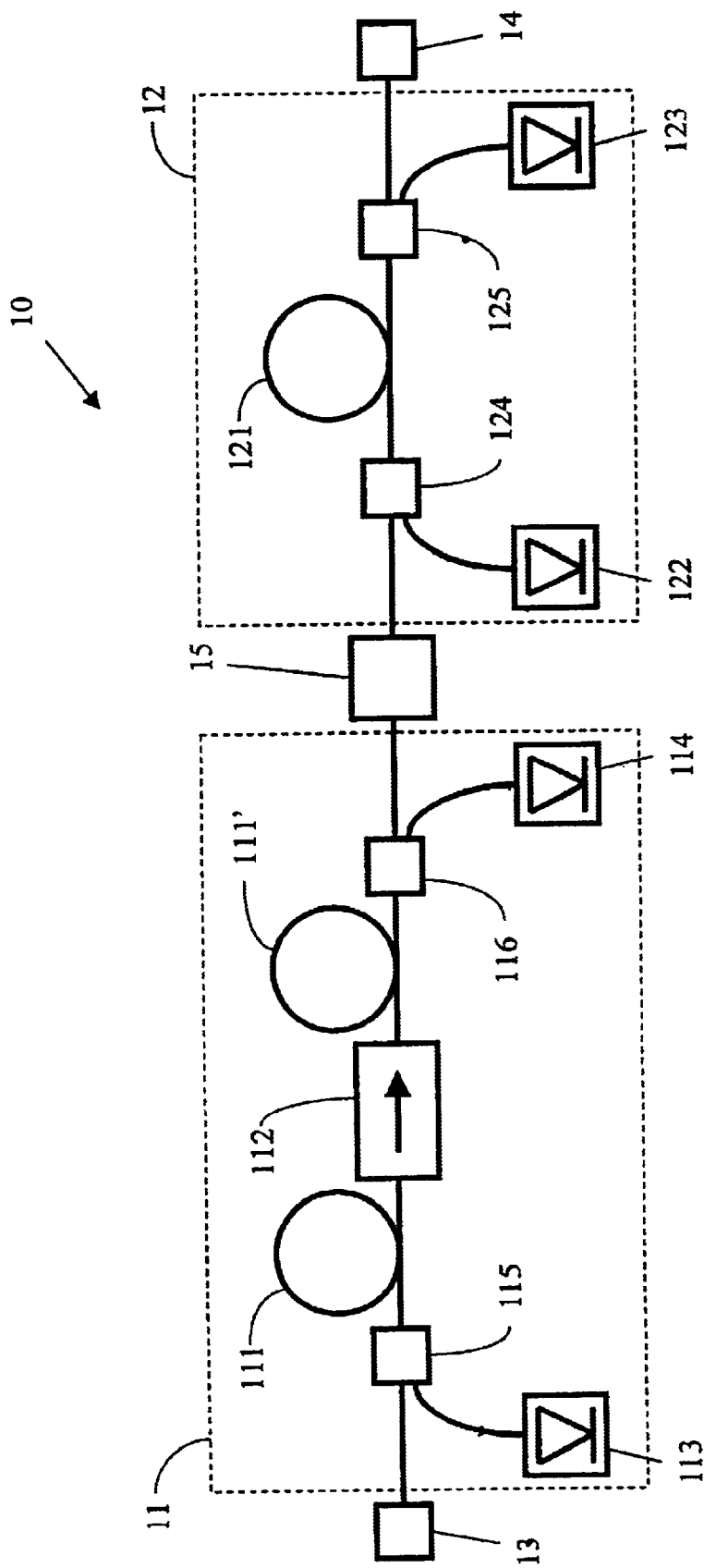
FIG. 2 diagrammatically shows an example of optical amplifier comprising a bidirectionally pumped optical amplifier.

The skilled in the art readily appreciates that the configuration of FIG. 2 is only exemplary, and other configurations of amplifiers may exploit a bidirectionally pumped section.

In an experiment simulated by the Applicant with a setup according to FIG. 2, lasers 113, 114 were 980 nm pump lasers. Two signal channels in the 1550 nm band having total power of −12 dBm were inserted through the input terminal 13, amplified to reach a power level of 9.5 dBm after the first EDF 111 and a power level of 12.7 dBm after the second EDF 111'. The wavelengths of the channels were 1545 nm and 1558 nm. In a first test, pump lasers 122, 123 in the wavelength range around 980 nm were used for the booster section; in a second test, pump lasers 122, 123 in the wavelength range around 1480 nm were used; in a third test, only one laser 122, generating co-propagating pump light in the wavelength range of 980 nm was used. The absorption coefficient of the EDF was about 5 dB/m for a wavelength around 1550 nm. The length of the EDF 121 was 10 m.

For all these tests, the total power ($P_{tot}$) and the power-per-channel ($P_{1545}$, $P_{1558}$) was evaluated at the output terminal 14, together with the signal-to-noise ratio (SNR). Results are reported in the following table 1. For convenience, laser 122, generating co-propagating pump light, is indicated as $P_1$; laser 123, generating counter-propagating pump light, is indicated as $P_2$.

TABLE 1

| $P_1$, λ (nm) | $P_1$, power (mW) | $P_2$, λ (nm) | $P_2$, power (mW) | $P_{tot}$ (dBm) | SNR (dB) | $P_{1545}$ (dBm) | $P_{1558}$ (dBm) |
|---|---|---|---|---|---|---|---|
| 980 | 150 | 980 | 150 | 22.90 | 36.17 | 19.84 | 19.94 |
| 1480 | 150 | 1480 | 150 | 19.26 | 36.28 | 15.70 | 16.70 |
| 980 | 300 | — | — | 19.93 | 36.17 | 16.50 | 17.30 |

As it can be seen from table 1, a configuration with co- and counter-propagating pump light allows to obtain a higher output power with respect to a configuration with only a co-propagating pump light. Further, bidirectional pumping is more effective at 980 nm with respect to 1480 nm. Table 1 clearly shows that bidirectional pumping at 980 nm is advantageous also in terms of SNR and, significantly, in terms of flatness of the gain curve. In order to evaluate flatness, the difference between $P_{1545}$ and $P_{1558}$ was considered.

In the 980 nm pumping band, which is often referred in the literature as "980 nm window", the absorption band of the EDF ranges from about 968 nm to about 986 nm, whereas the gain spectrum of a 980 nm semiconductor pump laser is typically 60 nm wide. Thus, in a bidirectional pumping scheme, unabsorbed residual pump from one laser can be injected in the other laser, inducing instabilities in the optical emission of the latter.

Figure 3:
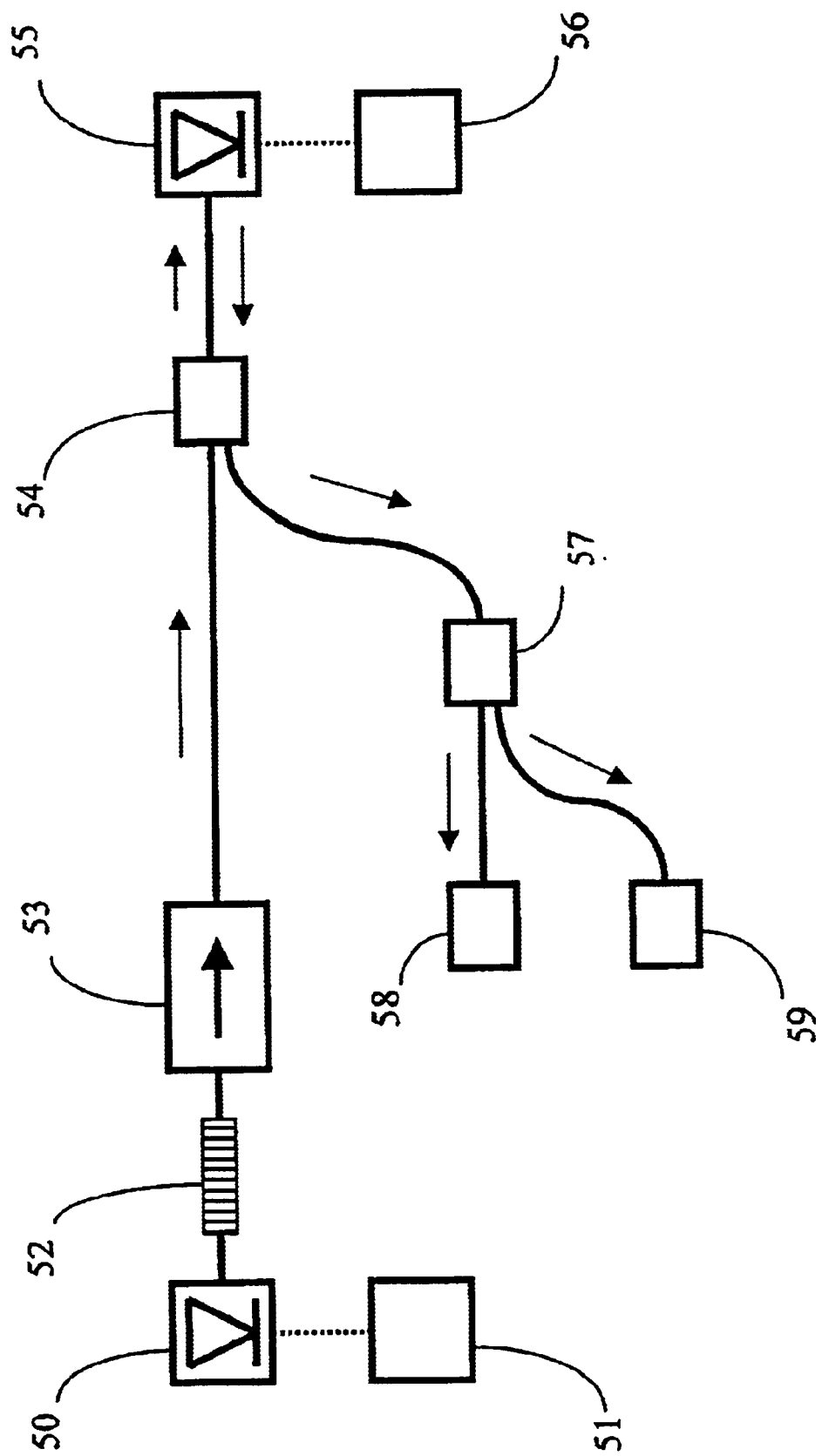
FIG. 3 diagrammatically shows an experimental setup for studying instability induced by the residual pump.

Applicant has studied this kind of instability using the experimental setup schematically shown in FIG. 3. For convenience, optical connections (realized by single mode optical fibres) are shown by solid lines in FIG. 3, whereas electrical connections are shown by dotted lines. A first semiconductor laser 50 emitting in a band around 980 nm, associated with respective temperature and current control circuits 51, was connected to a first stabilizing fibre grating 52 and then to an isolator 53 for light of 980 nm. The output of the isolator 53 was then connected to a first port of a first 2×1 single mode fibre coupler 54 for the 980 nm wavelength. A second semiconductor laser 55 emitting in a band around 980 nm, associated with respective temperature and current control circuits 56, was connected to a second port of the 2×1 fibre coupler 54. A power meter 58 and an optical spectrum analyzer 59 were connected to two ports of a second 2×1 single mode fibre coupler 57 for 980 nm while a third port of the second 2×1 fibre coupler 57 was connected to a third port of the first 2×1 fibre coupler 54, in order to measure optical emission (total power and spectrum) from the second laser 55.

The fibre grating 52 was set for stabilizing the emission of the first laser 50 around 971 nm. The reflectivity of the grating 52 was of about 5% and its bandwidth was of about 0.5 nm. The power ratio in the arms of the first and second 2×1 fibre couplers 54, 57 was 80/20.

Lasers 50, 55 used for the experiment were E2 pump modules for terrestrial applications, produced by the Applicant. Optical isolator 53 was a 980 nm optical isolator, produced by Tokin, having an insertion loss of 1.2 dB and an extinction ratio of 30 dB.

The free running wavelength of the non-stabilized second laser 55 ranged from about 974 to about 976 nm.

In operation, emission from first laser 50 is stabilized in a well defined wavelength range around 971 nm, travels through isolator 53 and coupler 54 and is injected in second laser 55. Emission from second laser 55 is splitted by coupler 54, so that 80% of the emitted power is sent towards the power meter 58 and the spectrum analyzer 59. The remaining 20% of the emitted power from the second laser 55, sent by coupler 54 towards laser 50, is blocked by optical isolator 53. Optical isolator 53 also blocks emitted power from laser 50 back-reflected by coupler 54. In such way, optical emission from first laser 50 is completely stable.

Figure 4:
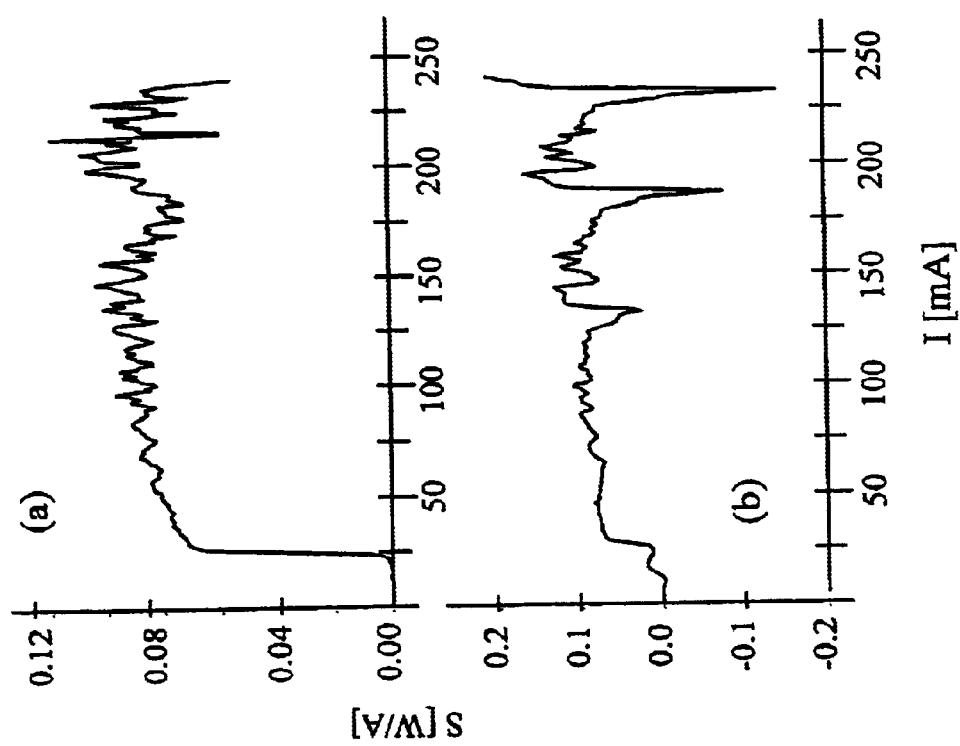
FIGS. 4a–4b show a plot of the slope of the P-I curve of a non-stabilized pump laser, respectively in case of no external injection and in case of external injection.

FIG. 4 shows the results of some measurements made with the setup of FIG. 3. In particular, FIG. 4 shows a comparison between the slope of the power per driving current (P-I) curve of the second laser 55 respectively when the first laser 50 is switched off (FIG. 4*a*) and when the first laser 50 is switched on (FIG. 4*b*), causing an injected power of 1.2 mW to reach the second laser 55. The slope of the P-I curve is plotted versus the pumping current I applied to the second laser 55. As it can be seen in FIG. 4*a*, when the first laser 50 is switched off, that is, when no injected power reaches the second laser 55, small oscillations are present in the curve around a mean value of the slope of the P-I curve of about 0.08 W/A. When the first laser 50 is switched on and a small injected power (about 1.2 mW) reaches the second laser 55, nonlinearities appear in the P-I curve in correspondence of current values around 130 mA, 180 mA and 230 mA. FIG. 4*b* shows such a behaviour. In particular, negative slope values are reached, which are not present in the curve of FIG. 4*a*. Such nonlinearities of the P-I curve, represented by the abrupt negative spikes shown in FIG. 4*b*, are generally indicated in the art with the term "kinks". Kinks in the P-I curve should be avoided in a laser, and in particular in a laser for pumping optical amplifiers, since the emitted power decreases for increasing applied current, with a corresponding instability in the amplifier control loop.

Figure 5:
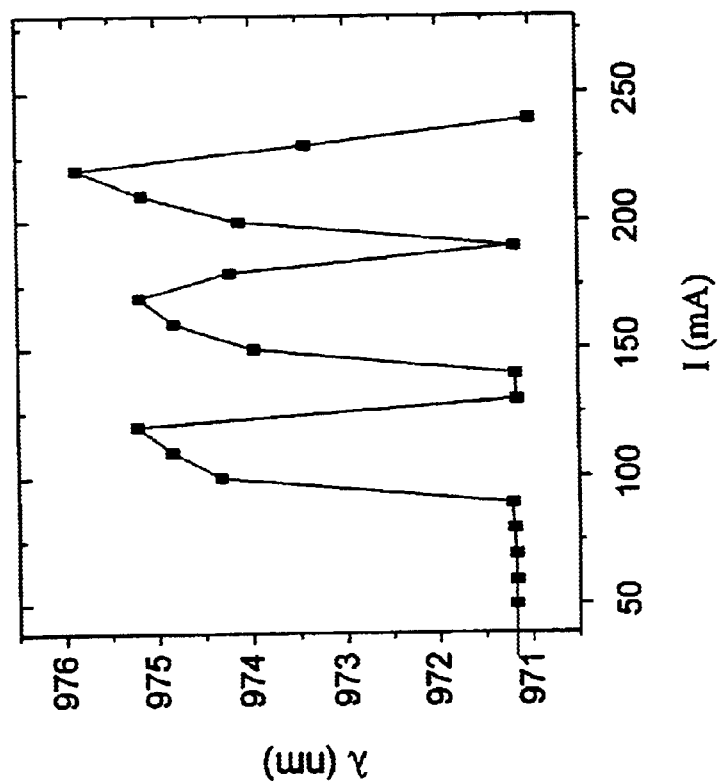
FIG. 5 shows a plot of the wavelength versus current of a non-stabilized pump laser externally injected in the same conditions of FIG. 4b.

FIG. 5 shows the corresponding plot of the emitted wavelength of the second laser 55 in the same conditions of FIG. 4*b*, that is, with an injected power of 1.2 mW from the first laser 50 to the second laser 55. The plot of the wavelength is shown versus the pumping current I of the second laser 55. As it can be seen, oscillations between the free running wavelength (974–976 nm) and the wavelength of the emitted light of the grating-stabilized first laser 50 (971 nm) occur, in correspondence to the kinks seen in FIG. 4*a*.

Figure 6:
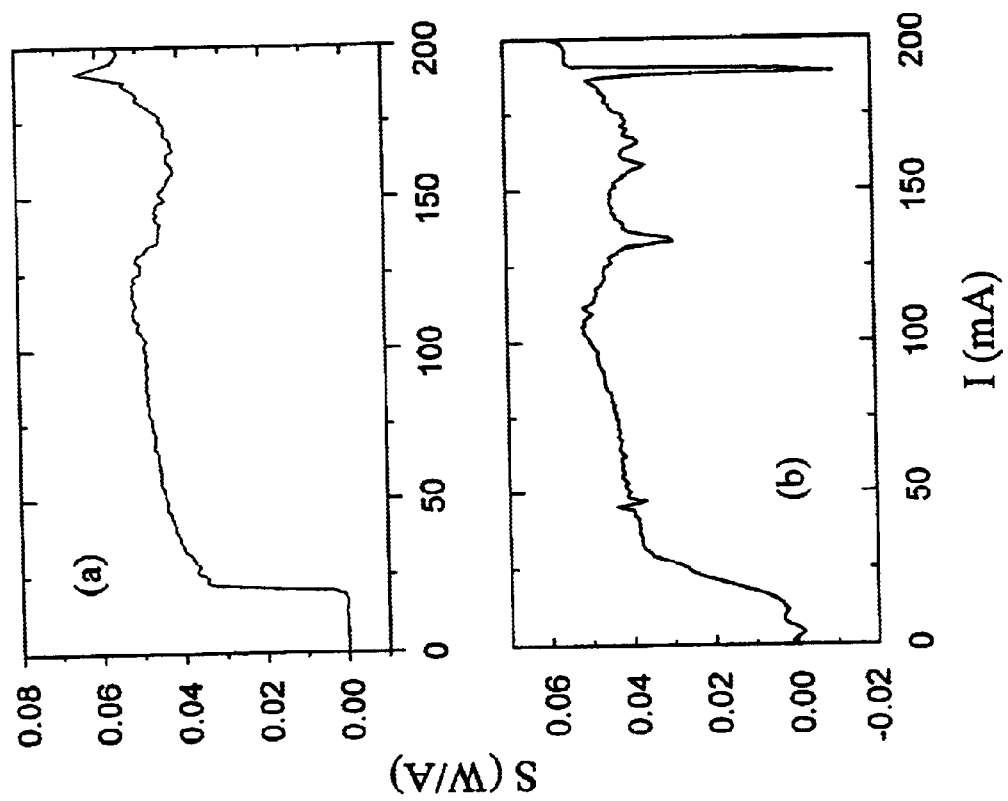
FIGS. 6a–6b show a plot of the slope of the P-I curve of a grating-stabilized pump laser, respectively in case of no external injection and in case of external injection.

A similar behaviour is observed if the experimental setup of FIG. 3 is slightly modified by adding a second grating centered on a second wavelength value in front of second laser 55, that is between laser 55 and 2×1 coupler 54. For example, FIG. 6*a*, 6*b* show the result of an experiment in which a grating centered around a wavelength value of 975 was added in front of second laser 55. In this experiment, the grating 52 in front of the first laser 50 was centered around a wavelength value of 977 nm. In particular FIG. 6*a* shows the slope of the P-I curve of the second laser 55 when first laser 50 is switched off, whereas FIG. 6*b* shows the slope of the P-I curve of the second laser 55 when first laser 50 is switched on and a power of 5 mW is injected towards second laser 55. As it can be seen in FIG. 6*b*, kinks appear at current values around 130 mA and 180 mA.

Figure 7:
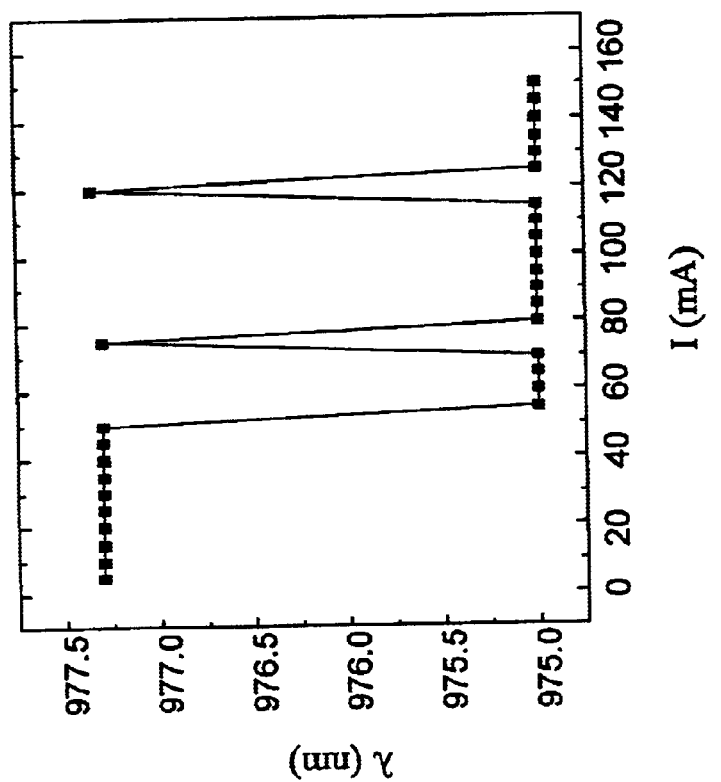
FIG. 7 shows a plot of the wavelength versus current of a grating-stabilized pump laser externally injected, in the same conditions of FIG. 6b.

FIG. 7 shows the corresponding plot of the emitted wavelength of the second laser 55, in the same conditions described for FIG. 6*b*: as it can be seen, as long as the current is below about 50 mA, the emitted stabilized wavelength of the second laser 55 is centered around a value of 977 nm (that is the wavelength of the stabilizing grating of the first laser), whereas for greater current values the emitted power is mainly confined around a wavelength value of 975 nm (that is the wavelength of the stabilizing grating of the second laser), but oscillations are still present for current values around 75 mA and 120 mA. In this case, instabilities in the spectrum and in the P-I curve are induced for an injected power more than four times higher than in the case of second laser not grating-stabilized (5 mW versus 1.2 mW).

Applicant has discovered that even though external injection usually induces optical instability in the emission of a pump laser, if the power of the injecting radiation is sufficiently large the wavelength emission of the pump laser may be stably locked by the external injection. In particular, a result obtained by the Applicant is that the wavelength emission of a pump laser may be stably confined in a bandwidth not lower than about 0.5 nm around the center wavelength of the external injection. This optical stabilization is performed without need of an external stabilizing grating in front of the laser itself. The above indicated large emission bandwidth normally assures multi-longitudinal-mode operation of the injected pump laser. The useful "locking bandwidth", that can be defined as the maximum difference in wavelength between the free running wavelength of the injected laser and the wavelength of the injection that ensures the locking may be of several nanometers. In particular, the higher the injected power the wider the locking bandwidth.

If the injection comes from a further pump laser whose optical emission is stabilized by a grating, the grating-stabilized pump laser acts as a "master" and the non-stabilized pump laser acts as a "slave", in a master-slave configuration.

The locking conditions depend on the injected power and on the power emitted by the injected laser. Applicant has determined that a stable optical emission of the injected laser may be ensured if the injected power is preferably chosen so that the ratio between the output power of the injected laser and the injected power is lower than 15 dB. More preferably, the above ratio should be lower than 10 dB, even more preferably lower than 8 dB.

With such injected power values, the useful locking bandwidth may reach values of 10–15 nm. The minimum locking bandwidth is determined by the spectral width of the injection. In the above mentioned master-slave configuration, the spectral width of the injection is determined by the bandwidth of the stabilizing grating of the master laser. Typical values of bandwidth of the gratings used with pump lasers are of about 0.5 nm.

The obtained locked optical emission bandwidth of the injected laser typically results to be higher than 0.5 nm and may reach values of about 2 nm.

It has to be noticed that the large values of locking bandwidth, as well as the large emission bandwitdh of the slave laser, cannot be achieved in the first described injection-locking technique for stabilizing emission of transmission lasers. Further, it has to be noticed that, as said, the emission bandwidth of the slave pump laser normally assures multi-longitudinal mode operation of the laser itself, whereas the above described injection-locking technique is actually a technique for suppressing the side modes and achieving single-longitudinal mode operation. At least these facts allow to say that the stabilization technique that was found by the Applicant is actually a different technique from known injection-locking stabilization.

The stability of the emitted wavelength is evaluated by calculating the normalized power in band (PIB) around the wavelength value $\lambda_1$ of the locking radiation, that is the function $$PIB = \frac{\int_{\lambda_1-1nm}^{\lambda_1+1nm} P(\lambda) d\lambda}{\int_{-\infty}^{+\infty} P(\lambda) d\lambda}$$

For a laser injected by a radiation of wavelength $\lambda_1$, the above function PIB is the ratio of the power emitted by the laser in a wavelength range of two nm centered on the wavelength $\lambda_1$, versus the total power emitted. A PIB of at least 0.8 is sufficient to say that the laser operates in optically stable regime around the wavelength value $\lambda_1$, that is the emission of the laser is stably locked on the wavelength of the injection, in a bandwidth of about two nm.

Coming back to the experimental setup of FIG. 3, once the free running wavelength of the laser 55 is known, it is possible to choose a suitable grating 52 to be put in front of the injecting laser 50 depending on the power of the injecting radiation. Such grating should be centered on a wavelength value comprised in a range which depends on the injected power. By choosing a suitable grating 52 and injecting a suitable power into the second laser 55, the emission from the second laser 55 can be locked, that is not less than 80% of the emitted power is comprised in a wavelength range of two nm around the center wavelength of the grating 52.

In order to evaluate the PIB behaviour, Applicant has conducted a series of simulations, by reproducing the setup of FIG. 3. Use of different gratings was provided in front of first laser 50, the gratings being centered on wavelengths ranging from 968 nm to 984 nm, with step of two nm. The grating reflectivity was of about 5%. The grating bandwidth was of about 0.5 nm. It has to be noted that the range of wavelengths from 968 nm to 984 nm roughly corresponds with the pumping band of erbium in an EDF. Further, different injected power values $P_{inj}$ coming from first laser 50 were provided. Results of this series of experiments are reported in FIGS. 8a to 8h.

Figure 8:
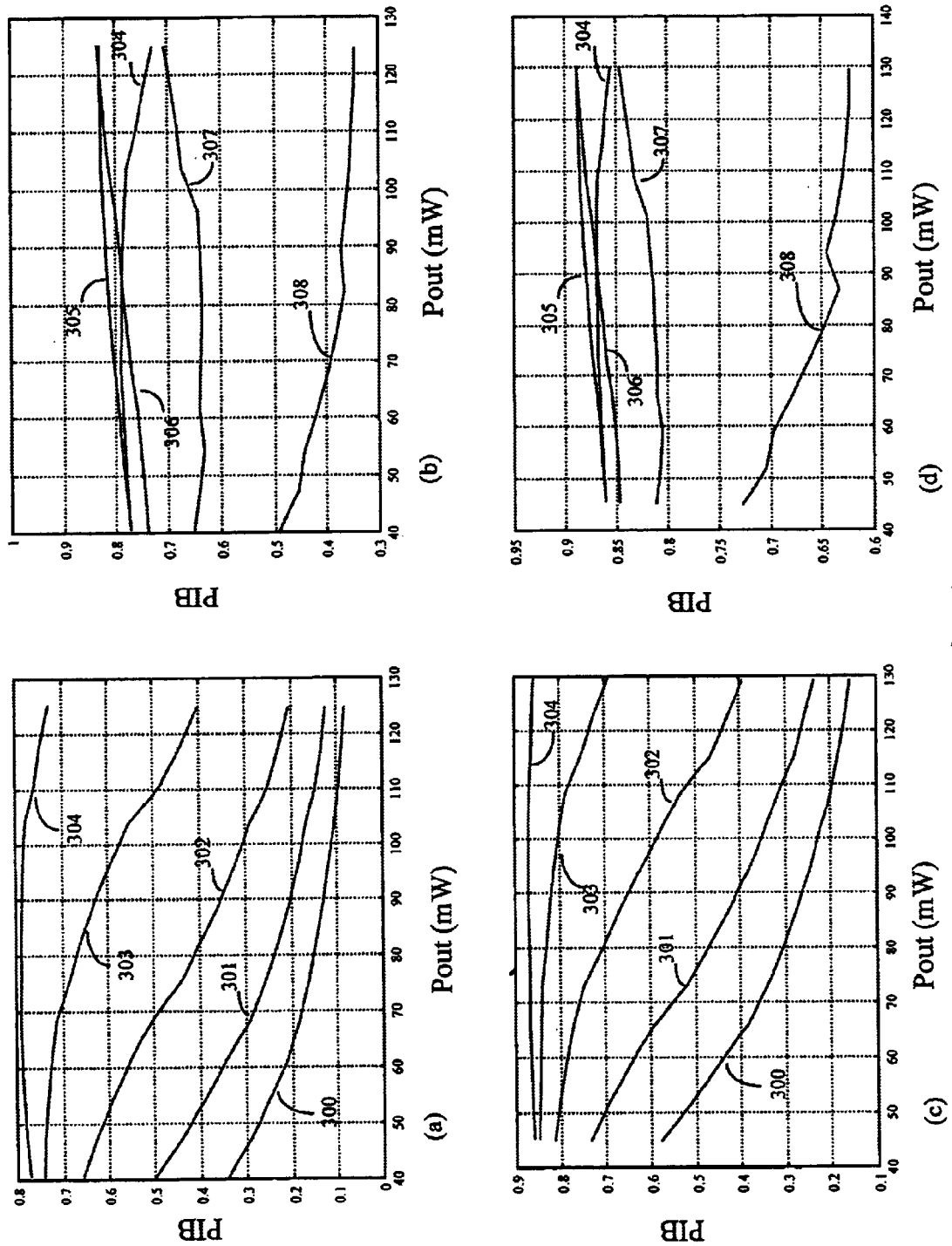
FIGS. 8a to 8h show plots of the power-in-band versus the emitted power of a laser externally injected with growing injected power, in which the different curves correspond to injecting radiation of different wavelengths.
Figure 8:
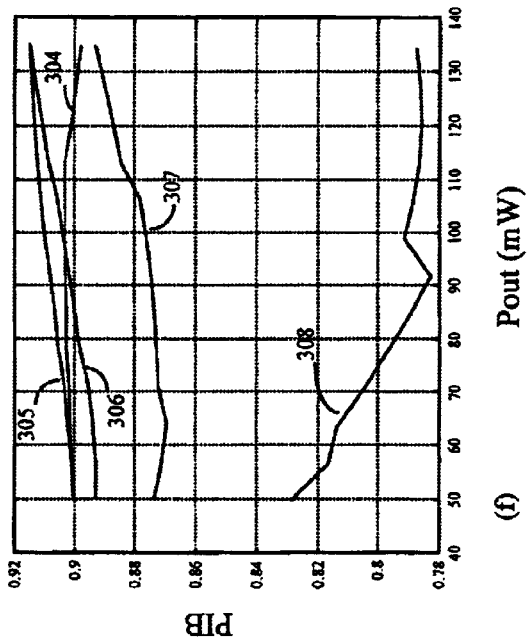
Figure 8:
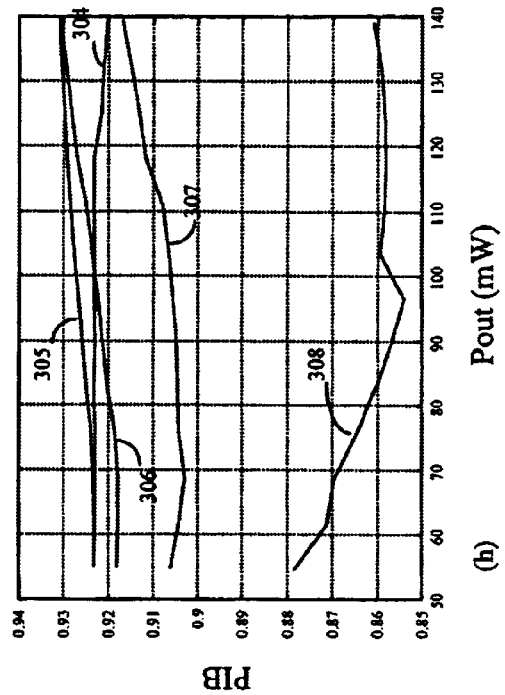
Figure 8:
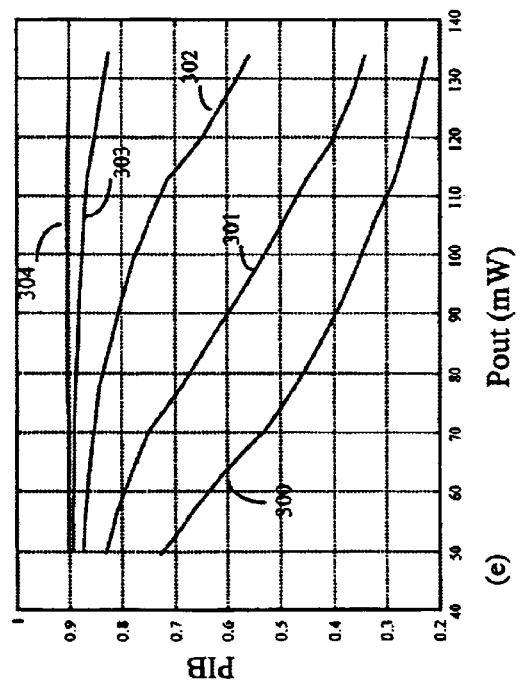
Figure 8:
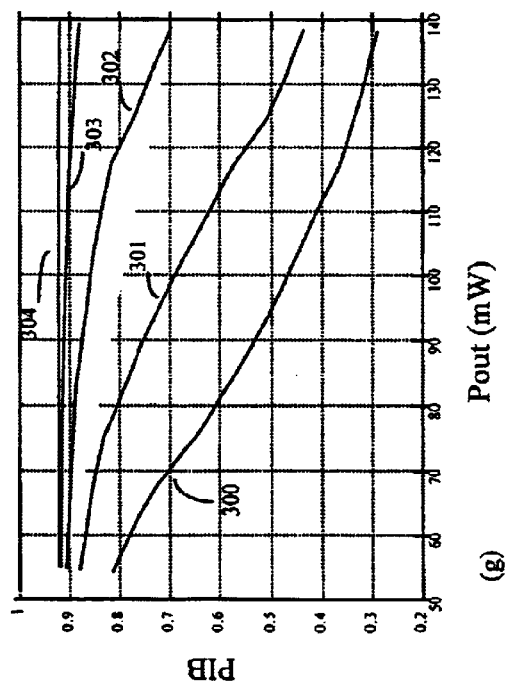

FIGS. 8a and 8b show the obtained plots of the PIB versus total power emitted $P_{out}$ of the injected laser, that is the second laser 55 (see FIG. 3), with an injected power of 5 mW. Each of the different curves relates to a different grating used for stabilizing first laser 50. The following table 2 resumes the link between the curves shown in FIGS. 8a to 8h and the wavelength of the gratings used.

TABLE 2

| | Curve | | | | | | | |
|---|---|---|---|---|---|---|---|---|
| | 300 | 301 | 302 | 303 | 304 | 305 | 306 | 307 | 308 |
| $\lambda_1$ (nm) | 968 | 970 | 972 | 974 | 976 | 978 | 980 | 982 | 984 |

For clarity's sake, FIG. 8a comprises curves obtained using gratings centered on wavelengths lower than or equal to the threshold wavelength of the injected laser (976 nm), whereas FIG. 8b comprises curves obtained using gratings centered on wavelengths greater than or equal to the threshold wavelength of the injected laser. Curve 304 is reported both in FIG. 8a and in FIG. 8b as it relates to a sort of "borderline grating". As it can be seen in FIG. 8a, none of the curves reaches an acceptable power in band of 0.8; on the other hand, FIG. 8b reports that curve 305 relating to the 978 nm grating exceeds 0.8 of PIB for an output power of the injected laser greater than about 65 mW, and also that curve 306 relating to the 980 nm grating exceeds 0.8 of PIB for an output power of the injected laser greater than about 95 mW. It has to be noted that power values of 65 and 95 mW are not hard to be reached for a pump laser operating in an optical amplifier: typical values of output power for pump lasers in EDFA are in fact in a range comprised between 15 mW and 150–160 mW.

FIGS. 8c and 8d show the plot of the PIB versus the output power of the injected laser for an injected power $P_{inj}$ of 10 mW. The different curves relates to the different gratings used, as in previous figures. As it can be seen, the number of curves or curve sections that exceeds 0.8 of PIB is higher than in the previous case. In particular, curves 304, 305, 306, 307 exceed 0.8 in the whole operative range of output power shown; moreover, curve 303 exceeds 0.8 as long as the output power is below 100 mW. The correspondence between curves reference numbers and grating wavelength can be found in the above table 2. According to FIGS. 8c and 8d, a stabilized emission of a laser having a threshold wavelength of 976 nm can be obtained if the injected radiation is in a wavelength range comprised between 976 and 982 nm: the stabilized emission can be performed in the whole operative range of output power of the laser itself. If the output power of the laser is maintained below 100 mW, the interval can be extended up to 974 nm. In such a way, the emission of the injected laser is mainly locked in a two nm interval around the wavelength of the injected radiation, according to the definition of PIB above mentioned.

FIGS. 8e and 8f show the plot as explained in the previous figures for an injected power of 15 mW. As it can be seen, the number of curves or curve sections that exceed a PIB value of 0.8 becomes larger as the injected power grows, comprising the whole curve 303 and sections of the curves 302 and 308. Thus, the interval of "locking wavelengths" is enlarged accordingly.

Such tendency is confirmed by FIGS. 8g and 8h, which show the plots for an injected power of 20 mW. In particular, the whole curve 308 is always above a PIB of 0.8.

Figure 9:
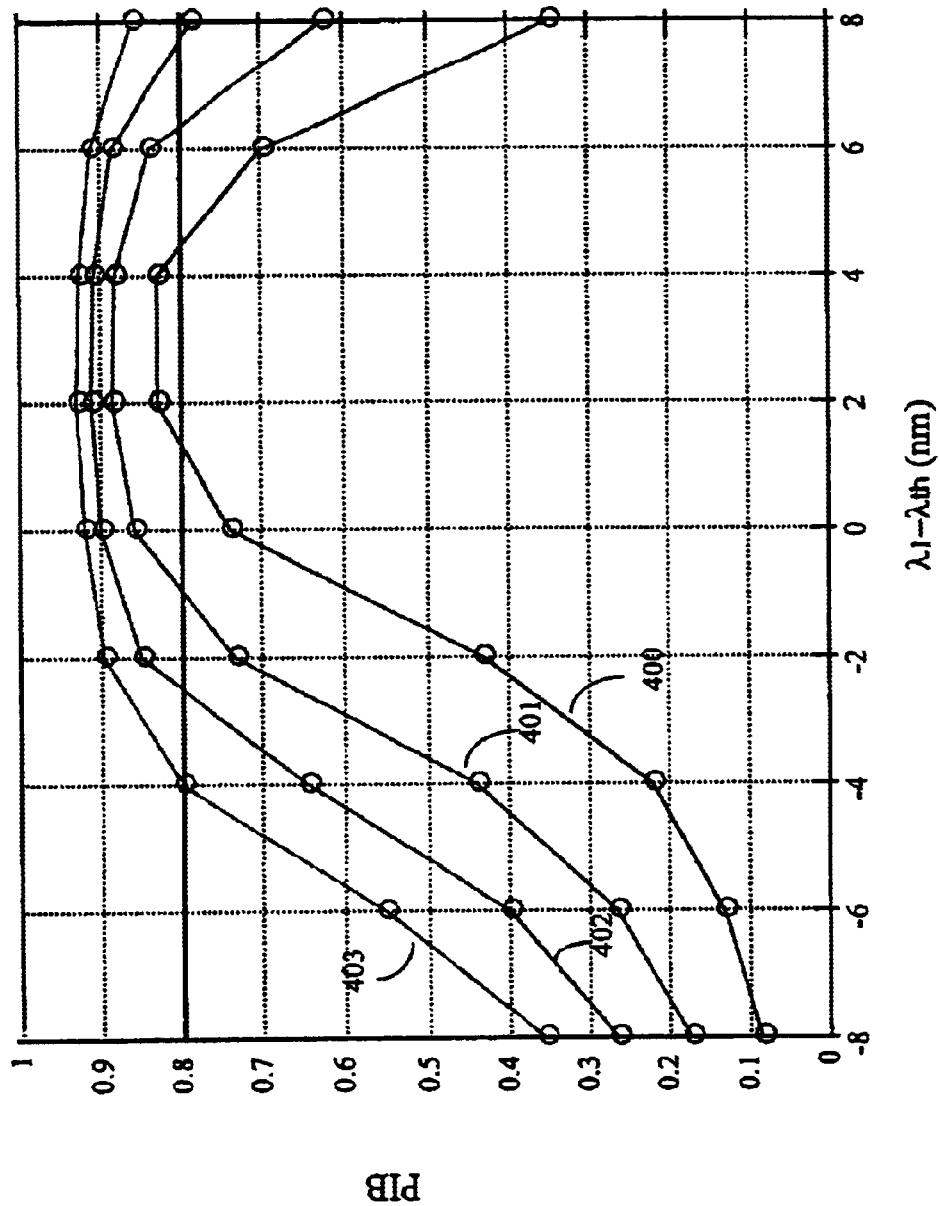
FIG. 9 shows a plot of the power-in-band versus the "detuning" of the injecting radiation for an injected laser, in which the different curves correspond to different values of injecting power and the laser emits a power of 120 mW.
Figure 10:
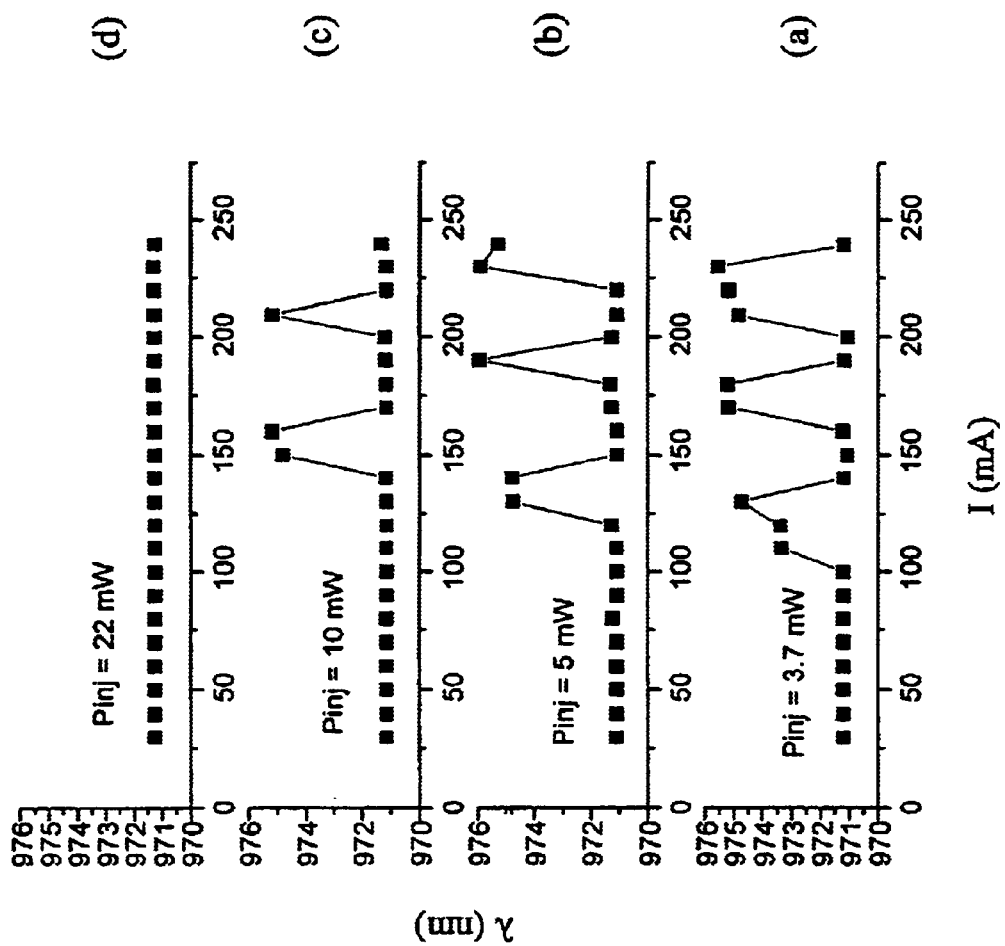
FIGS. 10a to 10d show plots of the wavelength versus current of a non-grating-stabilized pump laser externally injected with growing injected power.

FIG. 9 shows a plot of the PIB of the externally injected laser 55, emitting an output power of 120 mW, versus the difference between the wavelength of the injected radiation $\lambda_1$ (that is the center wavelength of the grating 52) and the threshold wavelength of the injected laser $\lambda_{th}$. Herein and in the following, we will refer to this difference in wavelength to as a "detuning" of the grating with respect to the threshold wavelength of the laser. FIG. 9 is based on the results shown in FIGS. 8a to 8h, as it was derived by taking the intersections of the different curves in FIGS. 8a to 8h with the value of output power of 120 mW and then joining the so-determined dots with segments. In particular, curve 400 was derived by taking such intersections from FIGS. 8a–8b and refers to an injected power of 5 mW; curve 401 was derived by taking the intersections from FIGS. 8c–8d and refers to an injected power of 10 mW; curve 402 was derived by taking the intersections from FIGS. 8e–8f and refers to an injected power of 15 mW; curve 403 was derived by taking the intersections from FIGS. 8g–8h and refers to an injected power of 20 mW. In the figure, the value PIB=0.8 is highlighted. In order to find the correct detuning for the grating to be put in front of the injecting laser 50 (see FIG. 3), one should take from FIG. 10 the abscissa of the points of intersection between the curves 400 to 403 with this value of PIB.

The following table 3 reports the detuning, taken as explained from FIG. 9, with respect to the injected power.

TABLE 3

| Injected power | Detuning ΔΛ (nm) |
| --- | --- |
| 5 mW | From +1 nm to +4 nm |
| 10 mW | From −1 nm to +7 nm |
| 15 mW | From −3 nm to +8 nm |
| 20 mW | From −4 nm to 10 nm |

As it can be seen from FIG. 9 and table 3, the detuning range grows as the injected power grows. At 5 mW of injected power, the detuning range is only about 3 nm wide, whereas at 20 mW of injected power the detuning range is about 14 nm wide, ranging from about 971–972 nm to 985–986 nm (which is very close to the amplitude of the 980 pump window of an EDF). As the detuning was referred to the threshold wavelength, the peaks of the curves 400 to 403 in FIG. 9 do not correspond to the value $\lambda_1=\lambda_{th}$, but, instead, to the value $\lambda_1=\lambda_{FRW}$, where $\lambda_{FRW}$ is the free running wavelength of the injected laser at 120 mW of output power. As it can be readily appreciated, the above specified detuning ranges correspond with the useful locking bandwidth at the different injected powers.

Clearly, instead of choosing the grating with the proper detuning as a function of the power of the injected radiation, one can derive from FIG. 9 and table 3 the proper power of the injecting radiation as a function of the detuning of the grating used. That is, FIG. 9 and table 3 can be read in both directions.

In order to extend the results reported in FIG. 9 and table 3, which relate to an output power of the injected laser of 120 mW, one can repeat the procedure used for obtaining FIG. 9 and plot the PIB versus the detuning for different values of output power of the injected laser (that is, for different free running wavelengths). Generally speaking, as it can be derived from FIGS. 8a to 8h, the lower is the output power of the injected laser, the wider is the detuning range which can be used, being equal the power of the injected radiation.

FIGS. from 10a to 10d show the results of a series of experiments made by the Applicant, using the experimental setup already described with reference to FIG. 3, in order to confirm the simulation results above described with reference to FIG. 9 and table 3. In the experiments, first laser 50 was stabilized with a grating centered around a wavelength of about 971 nm, whereas second laser 55 was left non-stabilized. The free running wavelength of the second laser 55 ranged between 973.5 nm and 976 nm. The different figures show the plot of the wavelength emission of the second laser 55, versus applied current, with different values of injected power $P_{inj}$ coming from first laser 50. As it can be seen, with injected powers up to 10 mW (FIGS. 10a to 10c), the wavelength oscillates between the free running wavelength (975–976 nm) and the wavelength of the injected radiation (971 nm). For injected power higher than 15 mW emission becomes stable in all the operative range of the laser. For example, FIG. 10d shows the plot of the wavelength for an injected power $P_{inj}$ of 22 mW: as it can be seen, no wavelength oscillations are present.

By comparing the results of FIGS. 10a to 10d with the table 3 above reported, it can be seen that the tested case corresponds to the third line of table 3, the detuning being of about −2.5 nm: in such case, the corresponding injected power to be used for locking the emission of the laser should be, according to table 3, of 15 mW for a total emitted power of 120 mW. A total emitted power of 120 mW corresponds, in FIGS. 10a to 10d, to an applied current of about 220 mA. As it can be seen, the agreement between the simulation and the experiment is verified.

The above described master-slave configuration of pump lasers can be advantageously exploited in a bidirectionally pumped optical amplifier, where pump residuals, due to unabsorbed pump radiation in the EDF, may furnish the injecting radiation. In this respect, Applicant has observed that in an EDF bidirectionally pumped by 980 nm lasers, pump residuals of 15–20 mW can be achieved.

Figure 11:
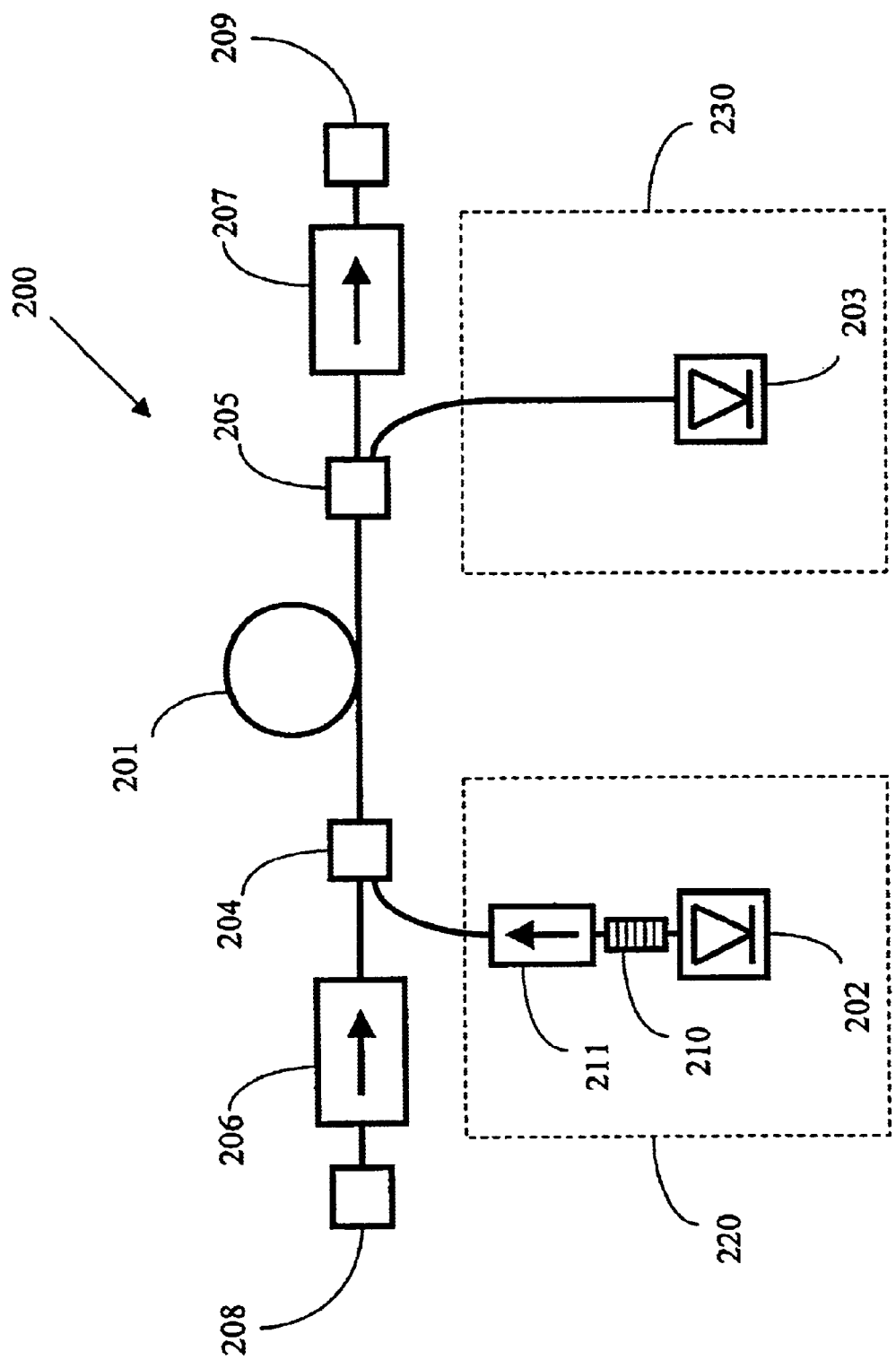
FIG. 11 schematically shows a preferred embodiment of a bidirectionally pumped optical amplifier 200 according to the present invention.

FIG. 11 schematically shows a preferred embodiment of a bidirectionally pumped optical amplifier 200. Optical amplifier 200 comprises an active fibre 201 and pump lasers 202, 203 comprised in pump branches 220, 230. WDM couplers 204, 205 are connected to the ends of the active fibre 201, for coupling in the active fibre 201 a pump radiation coming from lasers 202, 203. Input and output terminals 208, 209 respectively allow the insertion of an optical signal to be amplified in the optical amplifier 200 and the dropping of the amplified optical signal from the optical amplifier 200. Active fibre 201 is preferably an erbium doped fibre. Preferably, the absorption coefficient of the active fibre 201 is about 5 dB/m at 1550 nm. The length of the active fibre 201 is preferably lower or equal to 15 m. Pump lasers 202, 203 preferably emit in the 980 nm window, that is, in a range comprised between 968 and 986 nm. Preferably, the power emitted by at least one of the pump lasers 203, 203 is higher than 15 mW, more preferably higher that 50 mW, even more preferably, higher than 100 mW. Preferred embodiments of pump lasers suitable to be used in optical amplifier 200 are AlGaAs-InGaAs based semiconductor lasers. At least one optical isolator for the optical signal is typically added in the optical amplifier 200: in the embodiment of FIG. 11, two optical isolators 206, 207 are present.

Pump radiation from lasers 202, 203 is inserted in the active fibre 201 respectively in a co-propagating and counter-propagating direction. A wavelength selective reflector 210 (in the following, for brevity, "selective reflector") is added in one of the pump branches 220 for stabilizing the emitted wavelength of the enclosed laser 202. Selective reflector 210 has a low reflectivity, typically lower than about 10%, preferably lower than or equal to about 7%. Its bandwidth is typically of about 0.5 nm around a predetermined center wavelength. Preferably, selective reflector 210 is a grating, even more preferably a fibre grating. In the embodiment of FIG. 11, a selective reflector 210 is added in front of laser 202, generating co-propagating pump radiation. Preferably, the center wavelength of the selective reflector 210 is about 977 nm. On the other side, the second laser 203 has no selective reflector and thus it is not wavelength-stabilized. An optical isolator 211 for the pump radiation may also be added in the pump branch 220 comprising the wavelength-stabilized pump laser 202.

In an alternative embodiment (not shown), wavelength-stabilizing selective reflector 210 and optical isolator 211 are added in the pump branch 230, enclosing laser 203 which generates counter-propagating pump radiation, whereas laser 202, generating co-propagating pump radiation, is not wavelength-stabilized.

A control system, as a feedback system, not shown in FIG. 11, is typically added in order to control the operative conditions of the amplifier 200, that is, its amplifying range. In particular, the control system can accurately set the output power of the pump lasers 202, 203 depending on the amplifier specifications. Typically, the feedback system comprises a coupler, for example a 99:1 coupler, after the output of the amplifier 200, that allows to extract from the line a small portion of the amplified signal light. Such portion of signal is measured by means of suitable devices, well known in the art, such as a photodetector and a control electronics, the latter being also connected to the pump laser 202, 203, for controlling the driving currents thereof.

In operation, an optical signal is inserted in the optical amplifier 200 through input terminal 208, is amplified in the active fibre 201 and exits through output terminal 209. The optical signal may be, for example, a single channel or a collection of channels traveling in a WDM system, of which optical amplifier 200 is a part.

Energy for optical amplification is given by pump lasers 202, 203. Pump radiation from first laser 202 is coupled co-directionally in the active fibre 201 by means of first WDM coupler 204. Pump radiation from second laser 203 is coupled counter-directionally in the active fibre 201 by means of second WDM coupler 205.

A first pump residual coming from unabsorbed co-propagating pump radiation may reach the second WDM coupler 205 and be coupled towards the second pump laser 203. If the power of said first pump residual is properly selected, the emission wavelength of the second laser 203 may be locked by the residual, with a stable optical emission. In order to obtain this effect, the power of the pump residual should be preferably chosen in such a manner as the ratio between the output power of the second laser 203 and the injected power is lower than 15 dB, more preferably lower than 10 dB, even more preferably lower than 8 dB.

The lower the difference in wavelength between the free running wavelength of the second laser 203 and the center wavelength of the selective reflector 210, the lower the pump residual power that can ensure the locking. Preferably, the difference between the free-running wavelength of the second laser 203 and the center wavelength of the selective reflector 210 is preferably lower than 18 nm, more preferably lower than 8 nm, even more preferably lower than 5 nm.

Clearly, the power of the first pump residual is related to the operative conditions of the optical amplifier 200: in particular, it is related to the output power of the first pump laser 202.

A second pump residual coming from unabsorbed counter-propagating pump radiation may reach the first WDM coupler 204 and be coupled towards the first pump laser 202. This second pump residual is advantageously blocked by the optical isolator 211, so that optical emission from first laser 202 can be maintained stabilized. If the power of the second pump residual is kept sufficiently low with respect to the output power of the module comprising laser 202 and selective reflector 210, the optical isolator 211 may be eliminated. A low residual power is not sufficient for triggering instability in the optical emission of first laser 202. The power of the second pump residual is related to the operative conditions of the optical amplifier 200: in particular, it is related to the output power of the second pump laser 203.

In the above described operative conditions, active fibre 201 is pumped co-directionally by the first pump laser 202, the emission of which is stabilized by means of selective reflector 210, and counter-directionally by the second laser 203, the emission of which is in turn stabilized by exploiting locking effect due to residual pump injection.

Applicant has made a series of experiments in order to verify the functioning of an optical amplifier as described with reference to FIG. 11. Active fibre 201 was an OLA-2 erbium doped fibre, produced by the Applicant, having a coefficient of absorption $\alpha$ of 5.16 dB/m for a wavelength around 1550 nm; first pump laser 202 and grating 210 were included in a laser+grating LTA2 module, produced by the Applicant, stabilized for emission at 977 nm; second pump laser 203 was an E2 laser module, having a free running wavelength ranging from 978 to 981 nm (in dependence of applied current), produced by the Applicant; isolator 211 was a 980 nm optical isolator, produced by Tokin; WDM couplers 204, 205 were 980/1550 nm couplers, produced by E-TEK. The grating 210 was a fibre grating having reflectivity of about 5% and bandwidth of 0.5 nm around the center wavelength of 977 nm.

An optical signal of 3 dBm of power and wavelength of 1530 nm was inserted at the input port 208 of optical amplifier 200. Different lengths of active fibre and output powers of pump lasers 202, 203 were tested. Results are summarized in the following table 4, in which: L is the length of the active fibre; P1 is the output power of the first laser 202; P2 is the output power of the second laser 203; $P1_{res}$ is the first pump residual power, that is the power injected towards the second laser 203; $\lambda_1$ is the wavelength emission of the laser 202+grating 210 device, that is the wavelength of the pump residual injected towards the second laser 203; $P_{out}$ is the output power of the optical signal measured at the output port 209. It has to be clarified here that $P1_{res}$ is the pump residual power as measured when the second laser 203 is switched off. When laser 203 is switched on, the actual first pump residual power becomes higher, due to contribution of the counter-directional pump radiation to the population inversion in the active fibre 201.

TABLE 4

| L (m) | P1 (mW) | P2 (mW) | $P1_{res}$ (mW) | $\lambda_1$ (nm) | $\lambda_2$ (nm) | $P_{out}$ (dBm) |
|---|---|---|---|---|---|---|
| 20 | 130 | 160 | <0.05 | 977 | 980.3 | 18.1 |
| 20 | 130 | 0 | <0.05 | 977 | — | 17 |
| 15 | 130 | 160 | 0.4 | 977 | 980 | 19.7 |
| 10 | 130 | 160 | 6.2 | 977 | 977 | 20 |
| 10 | 85 | 75 | 3.6 | 977 | 977 | 17.5 |
| 10 | 70 | 60 | 2 | 977 | 977 | 15 |

As it can be seen, a length of the active fibre longer than 10 m leads in the tested example to residual powers that may be not sufficient to ensure locking of the emitted wavelength of the second laser 203. With a length of 10 m, residual powers of sufficient entity were reached: thus, locking of the wavelength of the second laser 203 was ensured and high output power from the amplifier 200 was obtained.

The range of $P1_{res}$ ensuring locking of the wavelength of the second laser 203 depends on various factors (like the laser gain curve or the output power of the amplifier, for example) and can be determined during the setup of the amplifier 200, for example by setting the feedback/control system in order to maintain the correct value of residual power for any output power of the second laser 203 (that is by properly regulating output power of the first laser 202). It has to be noted that the value of $P1_{res}$ measured when the second laser is switched off can be used as a conservative value for the whole life of the amplifier: as said, the actual residual power when the second laser 203 is switched on becomes higher, so the locking effect is always ensured.

Supposing that the output power of the amplifier should change (due, for example, to the adding of further channels in a WDM system, or to a faulty channel), the feedback/control system can check and regulate the correct output powers of the two pump lasers in order to maintain the wavelength locking of the second laser 203.

The test described with reference to table 4 was repeated with a wavelength of the optical signal of 1550 nm (input power 3 dBm). Wavelength locking of the second laser 203 was still observed with a fibre length of 10 m and the obtained output power of the optical amplifier 200 ranged from 16 dBm to 20.1 dBm, in dependence of the output powers of the pump lasers 202, 203.

A further test was performed, by eliminating the optical isolator 211. Optical stability of the emission of the first laser 202 was ensured when the second residual pump (due to unabsorbed pump radiation coming from second laser 203 entering in pump branch 220) was maintaned under values up to 5 mW. As an example, with a length of the active fibre 201 of 10 m, an output power of the first pump laser 202 of 130 mW, an output power of the second pump laser 203 of 160 mW, a first residual pump towards the first laser 202 of less than 5 mW was measured and no optical instability of the emission of the laser+grating module was observed.

In case the optical isolator 211 in front of the laser+grating module is omitted, the feedback/control system has to check that the pump residual towards the laser+grating module is maintained under a safety value. Such safety value can be for example the minimum residual power which does not cause instability in the laser+grating module measured when no optical signal is inserted at the input 208 of the optical amplifier 200. This is because when an optical signal travels and is amplified in active fibre 201, the residual pump is lower than the case of no optical signal travelling. Thus, the minimum residual power above mentioned is a conservative value. In order to maintain the residual power towards the laser+grating module sufficiently low, the feedback/control system can act on the output power of the locked laser 203, taking care of maintaining the locking condition as above explained. Advantageously, the use of the optical isolator 211 allows to simplify the control circuit of the feedback/control system.

Figure 12:
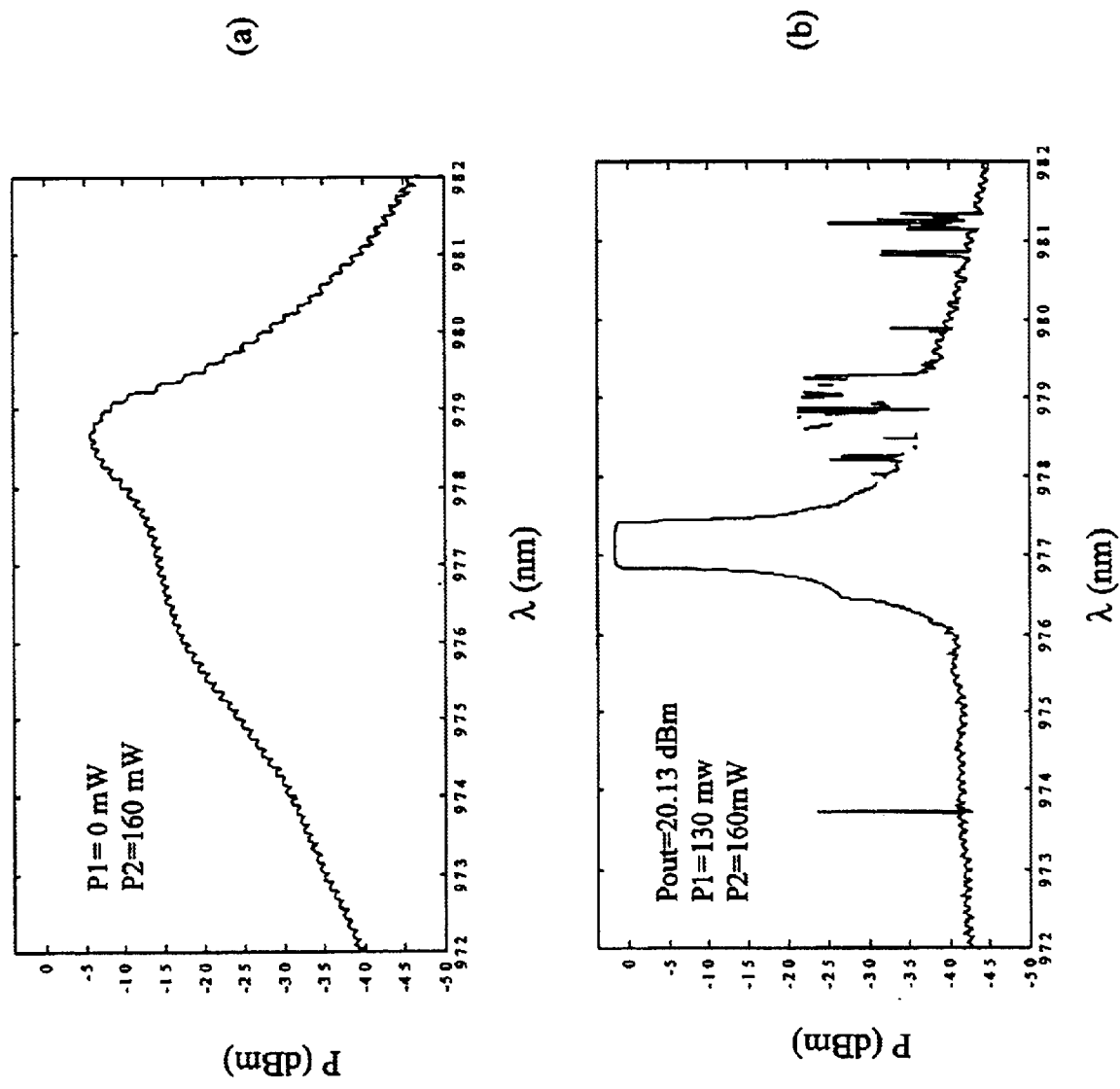
FIGS. 12a, 12b respectively show an emission spectrum of a non-wavelength-stabilized pump laser and an emission spectrum of a pump laser stabilized by means of external injection.

FIGS. 12a and 12b show the measured emission spectrum from the second pump laser 203, respectively in a non-wavelength-stabilized condition and when locked by external injection. The shown spectra were taken during the test with the optical amplifier setup above described with reference to FIG. 11.

In particular, FIG. 12a shows the free emission spectrum of the second pump laser 203 at an output power of 160 mW. Small oscillations along the curve are due to the plural longitudinal modes.

FIG. 12b shows the emission spectrum of the second laser 203 when injected by the residual unabsorbed pump radiation coming from the first laser 202: output power of the first laser 202 was 130 mW, output power of the second laser 203 was 160 mW, output power of the amplifier was 20.1 dBm. As it can be seen the optical emission was modified by the injection, to be substantially confined in a range of less than two nm around 977 nm. In this wavelength range, multi-longitudinal-mode operation is still present. In this respect, the peak around 977 nm was represented in FIG. 12b as "cut" around a value of 0 dBm, in order to highlight the longitudinal modes, in particular their spectral width.

Figure 13:
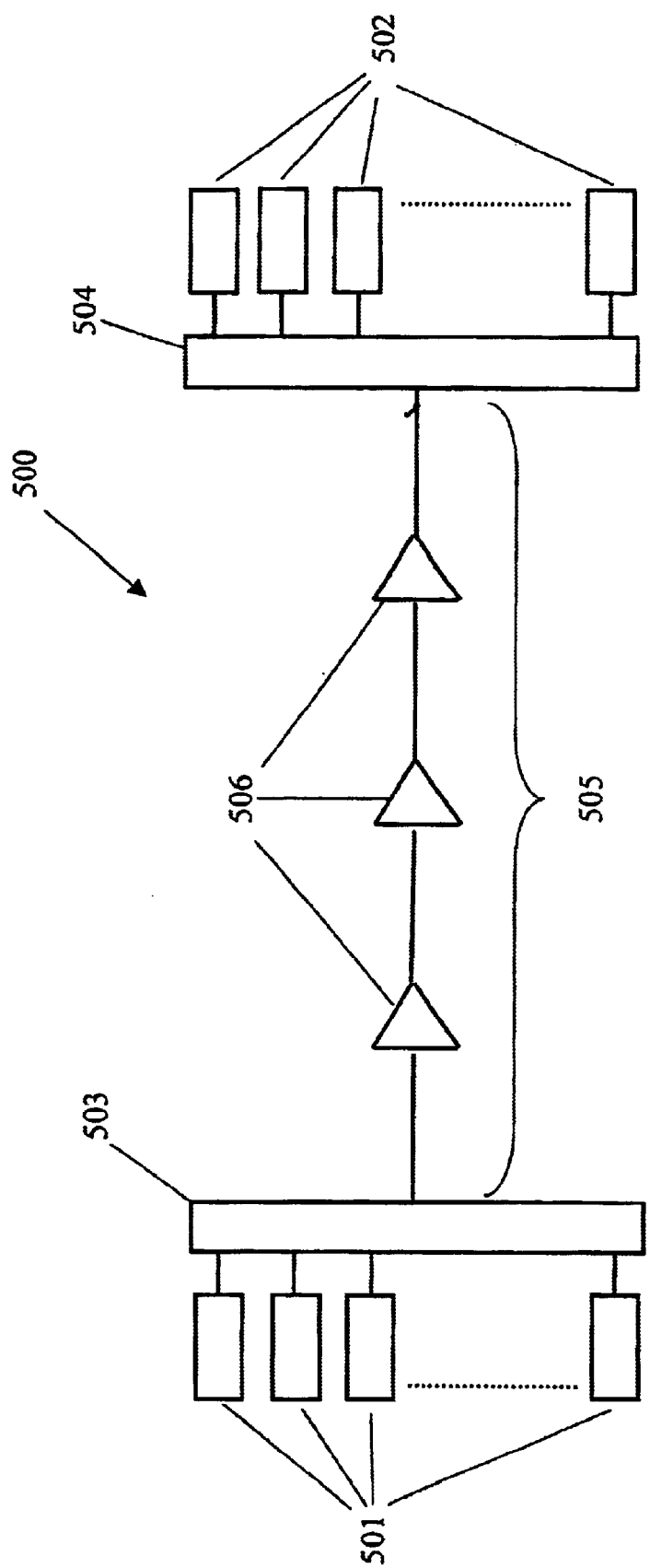
FIG. 13 schematically shows an optical WDM transmission system comprising a bidirectionally pumped optical amplifier according to the invention.

A bidirectionally pumped optical amplifier 200 as shown in FIG. 11 can be advantageously used in an optical transmission system, comprising at least one transmitter for emitting an optical signal, an optical transmission path, including at least one bidirectionally pumped optical amplifier according to the invention, and at least one receiver of said optical signal. In a typical configuration, schematically shown in FIG. 13, the optical transmission system is a WDM transmission system 500 comprising a plurality of transmitters 501, a plurality of receivers 502, a wavelength combiner 503, a wavelength demultiplexer 504, and an optical transmission path 505. The WDM system 500 also encloses one or more optical amplifier(s) 506 coupled along the optical transmission path 505. At least one optical amplifier 506 comprises a bidirectionally pumped optical amplifier according to the invention. The transmitters 501 are adapted for emitting optical signals at a different wavelength. The signals are coupled by the combiner 503 along the optical transmission path 505, amplified by the optical amplifier(s) 506, separated by the demultiplexer 504 according to their wavelength and sent each to the respective receiver 502. The wavelength of the signals is typically comprised in a range between 1520 and 1620 nm.

In particular, a bidirectionally pumped optical amplifier according to the invention can be advantageously used as a booster section 12 of an optical amplifier 10 as shown in FIG. 2, in an optical transmission system. In particular, it may be advantageously used for boosting channels comprised in the C-band (1520 nm–1560 nm) of a WDM series of channels.

Although the described examples were specifically referred to a laser emission wavelength range around 980 nm, Applicant believes that the features of the invention above described may be applied to other laser emission wavelength ranges, as for example around 1480 nm.

What is claimed is:

1. A method for pumping an optical amplifier comprising an active optical fibre, a first pump laser and a second pump laser, said method comprising:

coupling a first pump radiation at a predetermined wavelength emitted by said first pump laser in said active fibre in a first direction, coupling a second pump radiation emitted by said second pump laser in said active fibre in a second direction, opposite to said first direction, characterized by further comprising coupling a first pump residual in said first direction from said active fibre into said second pump laser, so as to lock the emission wavelength of said second pump laser around said predetermined wavelength.

2. A method as in claim 1, said second pump laser having a free running wavelength, characterized in that a difference between said free running wavelength and said predetermined wavelength is lower than 18 nm.

3. A method as in claim 2, characterized in that said predetermined wavelength and said free running wavelength are comprised between 968 nm and 986 nm.

4. A method as in claim 1, characterized in that a power ratio between an output power of said second pump laser and a power of said first pump residual is lower than 15 dB.

5. A method as in claim 1, characterized in that said locked emission wavelength of said second pump laser is comprised in an emission bandwidth of at least 0.5 nm.

6. A bidirectionally pumped optical amplifier comprising:
   an active fibre having two ends,
   a first WDM coupler and a second WDM coupler coupled to said ends,
   a first pump branch coupled to said first WDM coupler comprising a first laser and a selective reflector, for introducing pump radiation having a predetermined wavelength in said active fibre in a first direction,
   a second pump branch coupled to said second WDM coupler comprising a second laser, for introducing pump radiation in said active fibre in a second direction, opposite to said first direction,
   characterized in that
   the amplifier is adapted for coupling a pump residual from said active fibre into said second laser, said pump residual being selected so that the emission wavelength of said second laser is locked around said predetermined wavelength.

7. A bidirectionally pumped optical amplifier as in claim 6, characterized in that said first pump branch further comprises an optical isolator for said pump radiation.

8. A bidirectionally pumped optical amplifier as in claim 6, characterized in that a difference between said predetermined wavelength and a free running wavelength of said second laser is lower than 18 nm.

9. A bidirectionally pumped optical amplifier as in claim 8 characterized in that said predetermined wavelength and said free running wavelength are comprised between 968 nm and 986 nm.

10. A bidirectionally pumped optical amplifier as in claim 6, characterized in that a power ratio between an output power of said second laser and a power of said pump residual is lower than 15 dB.

11. A bidirectionally pumped optical amplifier as in claim 6, characterized in that the locked emission wavelength of said second laser is comprised in an emission bandwidth of at least 0.5 nm.

12. A bidirectionally pumped optical amplifier as in claim 11, characterized in that said locked emission wavelength is comprised in an emission bandwidth of about 2 nm.

13. An optical amplifier comprising:
   a pre-amplifying section, comprising at least one active fibre and at least one pump laser, and
   a booster section, comprising a bidirectionally pumped optical amplifier according to claim 6.

14. An optical transmission system comprising an optical transmission path, at least one transmitter and at least one receiver, said at least one transmitter and at least one receiver being coupled to said optical transmission path,
   characterized in that it further comprises at least one optical amplifier according to claim 6 coupled along said optical transmission path.

* * * * *